United States Patent
Pfalzer

(10) Patent No.: US 11,217,401 B2
(45) Date of Patent: Jan. 4, 2022

(54) EXPLOSION PROOF PRESSURE RESISTANT HOUSING

(71) Applicant: Siemens Aktiengesellschaft, Munich (DE)

(72) Inventor: Ulrich Pfalzer, Sulzfeld (DE)

(73) Assignee: Siemens Aktiengesellschaft, Munich (DE)

(*) Notice: Subject to any disclaimer, the term of this patent is extended or adjusted under 35 U.S.C. 154(b) by 0 days.

(21) Appl. No.: 17/094,952

(22) Filed: Nov. 11, 2020

(65) Prior Publication Data
US 2021/0142960 A1  May 13, 2021

(30) Foreign Application Priority Data
Nov. 12, 2019 (EP) ..................... 19208557

(51) Int. Cl.
*H01H 9/04* (2006.01)
*H05K 5/06* (2006.01)
*H05K 5/00* (2006.01)

(52) U.S. Cl.
CPC ........... *H01H 9/045* (2013.01); *H05K 5/0004* (2013.01); *H05K 5/0008* (2013.01); *H05K 5/0013* (2013.01); *H05K 5/0052* (2013.01); *H05K 5/06* (2013.01)

(58) Field of Classification Search
CPC .................................................... H01H 9/045
See application file for complete search history.

(56) References Cited

U.S. PATENT DOCUMENTS

| 6,766,950 B2 * | 7/2004 | Hall ..................... G06F 1/1635 235/400 |
| 2010/0089635 A1 * | 4/2010 | Hoeland .............. H05K 7/1462 174/520 |
| 2015/0155111 A1 * | 6/2015 | Kondrus .................. H01H 3/12 200/43.13 |

(Continued)

FOREIGN PATENT DOCUMENTS

| DE | 102011015646 | 10/2012 |
| DE | 102015223362 | 6/2017 |

(Continued)

OTHER PUBLICATIONS

EP Search Report dated May 25, 2020 based on EP19208557 filed Nov. 12, 2019.

*Primary Examiner* — Hung V Ngo
(74) *Attorney, Agent, or Firm* — Cozen O'Connor

(57) ABSTRACT

Explosion-proof pressure-resistant housing with a receiving part for electric operating components and with a closure part that closes the receiving part via a bayonet catch, wherein the closure part has a cylindrical segment that forms a flameproof joint when inserted into the receiving part, the cylindrical segment of the closure part has pins and the cylindrical outer wall of the receiving part contains longitudinal slots, at the ends of which longitudinal slots short transverse slots connect for receiving the pins, where a locking part is slid onto the closure part and includes locking elements distributed across the periphery and engaging in the longitudinal slots such that the pins are prevented from rotating out of the transverse slots, and where the locking part is fastened to the closure part via at least one fastener that detachable exclusively via a tool.

13 Claims, 2 Drawing Sheets

(56) References Cited

U.S. PATENT DOCUMENTS

2018/0110135 A1\* 4/2018 Sum .................... H05K 5/0247
2018/0348021 A1 12/2018 Ziems et al.

FOREIGN PATENT DOCUMENTS

| DE | 102017128816 | 6/2019 |
| EP | 2175707 | 4/2010 |
| WO | 2007090421 | 8/2007 |

\* cited by examiner

EXPLOSION PROOF PRESSURE RESISTANT HOUSING

BACKGROUND OF THE INVENTION

1. Field of the Invention

The invention relates to an explosion-proof pressure-resistant housing for electric operating components, which can comprise an optical gas analyzer, for instance.

2. Description of the Related Art

Electrotechnical products, which are installed and operated in an explosive environment, must conform to the legal protective measures for avoiding effective ignition sources within the scope of explosion protection. Housings in the ignition protection category "Flameproof enclosure" ("Ex d") must withstand the pressure of an explosion from an explosive mixture in the inside and prevent the outward transmission of the explosion. The explosion pressure depends on the free inner volume and on the shape of the housing. The housing must be correspondingly stable. In order to prevent the explosion from being transmitted outward through housing openings as a result of flame transmission (potential for ignition), with all outwardly leading housing gaps a minimal gap length must be met and a maximum gap width may not be exceeded. Furthermore, the surface temperature on the outer housing wall is not permitted to exceed the ignition temperature of the surrounding explosive atmosphere.

The closure of housings often previously took place via a closure part with a thread or with many individual screws or connecting parts. With a thread with a large diameter, there is the problem that it must be screwed in carefully, in order not to tilt, and that it can often only be opened again with difficulty. The opening and closing of the housing using many individual screws is very time-consuming.

EP 2 175 707 A2 discloses a housing with at least one cylindrical receiving part for electric operating components and with a closure part that closes the receiving via a bayonet catch. The receiving part has pins distributed across the periphery, while the inner wall of the closure part contains longitudinal grooves that extend in the plug-in direction in a distributed manner across the periphery, where the longitudinal grooves open at their ends into a transverse groove that extends at right angles to the plug-in direction to receive the pins. The housing can contain a number of interior spaces that are separated from one another, if e.g. an explosion protection must be realized with the corresponding electric or electronic device.

In order to always realize a similar gap, preferably with a zero gap width, in the connection position between the receiving part and the closure part, surfaces that extend at right angles to the plug direction are formed on the one part and corresponding counter surfaces are formed on the other part, where surfaces rest against one another in the connection position.

Furthermore, a catching recess can be formed on the one part and a lug can be formed on the other part, where the lug, in the connection position, engages into the catching recess and requires a special tool to release the bayonet joint.

WO 2007/090421 A1 discloses a field device constructed modularly for the process instrumentation. The various modules of the field device are connected to one another via a bayonet catch.

SUMMARY OF THE INVENTION

It is an object of the invention to provide an explosion-proof pressure-resistant housing with a receiving part for electric operating components and a closure part that closes the receiving part via a bayonet catch, where the closure part is manufactured very easily and cost-effectively on account of parts with a simple configuration and is moreover easy to handle, in particular easy to open and close.

This and other objects and advantages are achieved in accordance with the invention by an explosion-proof pressure-resistant housing with a receiving part for electric operating components and with a closure part that closes the receiving part by way of a bayonet catch, where the closure part has a cylindrical segment which, when inserted into a cylindrical outer wall or a cylindrical outer wall segment of the receiving part forms a flameproof joint, where the cylindrical segment of the closure part has pins distributed across the periphery and the cylindrical outer wall or the cylindrical outer wall segment of the receiving part contains longitudinal slots that extend in a distributed manner across the periphery in the plug direction, at the ends of the longitudinal slots short transverse slots that extend at right angles to the plug direction connect for receiving the pins, where a locking part is slid onto the closure part, the locking part having locking elements that are distributed across the periphery and that engage in the longitudinal slots such that the pins are prevented from rotating out of the transverse slots, and where the locking part is fastened to the closure part via at least one fastener that is detachable exclusively via a tool.

The inventive housing consists of few parts and can be easily assembled and disassembled. The parts themselves are assembled very easily and can therefore be manufactured easily and cost-effectively with only minimal material outlay. The closure part can therefore be formed as a simple cover with a cylindrical segment, which is inserted via the bayonet joint through a simple plug-in and rotational movement into the cylindrical outer wall or a cylindrical outer wall segment of the receiving part and is locked to the receiving part. The bayonet catch is locked against unintentional release by simply sliding the locking part onto the closure part. To prevent the locking part from being removed unjustifiably, the locking part is fastened to the closure part via a fastener, which can only be released with the aid of a special tool. The fastener can simply be a lock screw or an elastic snap-fit part that engages into a corresponding cut-out in the closure part. This cut-out can be formed as an annular groove, such that the locking part can be slid onto the closure part in any arbitrary rotary angle position and then locked.

In the structurally most simple case, the locking part has an annular segment which can be slid onto the closure part or is formed as a ring, on which the locking elements are formed as pins that extend in the plug direction. Alternatively, the locking part can have a cylindrical pipe segment which can be slid onto the receiving part, on the interior of which pipe segment the locking elements are formed as ribs that extend in the plug-in direction. Here, the locking part with the locking elements in the longitudinal slots and the pins in the transverse slots are advantageously covered by the cylindrical pipe segment. In the case of the annular segment or ring with the pins, coverage can also occur via a collar, which is slid onto the housing at the point of the bayonet joint. One such collar can have an angular outer contour, which protects the preferably cylindrical housing during handling, e.g., when assembling or disassembling the electric operating components, from rolling away.

In the case of electro-optical operating components, such as an optical gas analyzer, which measures a measuring gas outside of the housing, the closure part can contain an optical window, which is arranged preferably eccentrically with respect to the cylinder axis of the closure part, such that irrespective of its installation position in the receiving part, an outward line of sight can always be realized for the gas analyzer, by the closure part being locked on the receiving part in a suitable rotary angle position.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained by way of example below with reference to an exemplary embodiment illustrated in the figures, in which.

DETAILED DESCRIPTION OF THE EXEMPLARY EMBODIMENTS

Figure 1:
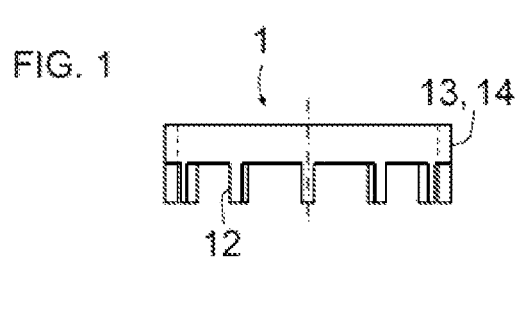
FIG. 1 shows a side view of the locking part in accordance with the invention.

In the drawings, the same parts are each provided with the same reference signs. The representations are schematic and not true to scale.

Figure 2:
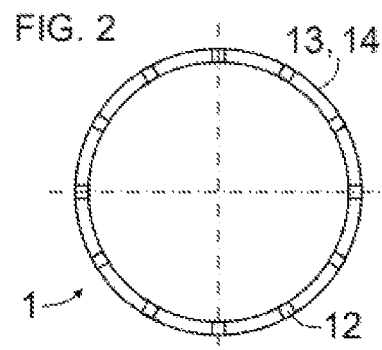
FIG. 2 shows a top view of the locking part in accordance with the invention.
Figure 3:
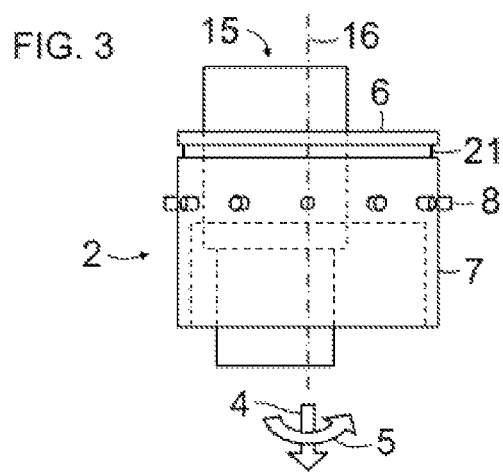
FIG. 3 shows a side of a closure part in accordance with the invention.
Figure 4:
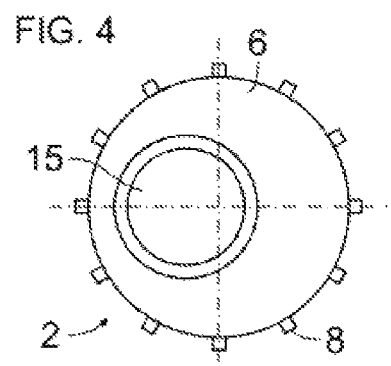
FIG. 4 shows a top view of the closure part in accordance with the invention.
Figure 5:
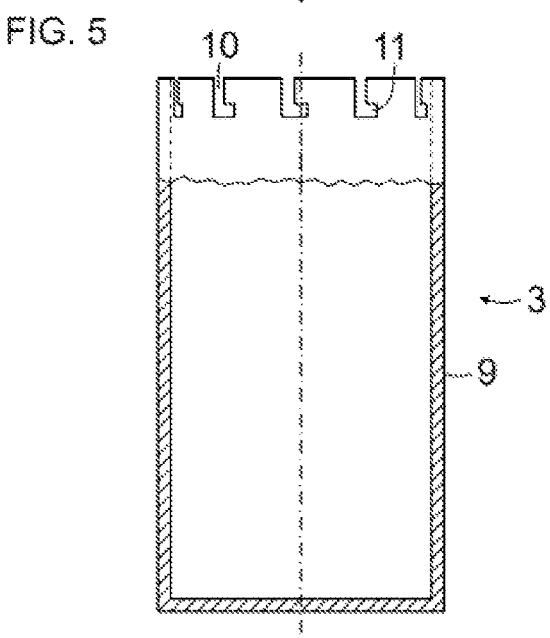
FIG. 5 shows a side, partially sectionally view of a receiving part for electric operating components in accordance with the invention.

FIG. 1 and FIG. 2 show a locking part 1, which is used to protect a closure part 2, shown in FIG. 3 and FIG. 4, against inadvertent or unauthorized removal from a receiving part 3 shown in FIG. 5 for electric operating components.

The receiving part 3 and the closure part 2 are configured to be connected to one another via a bayonet catch via a plug-in movement 4 and subsequent rotational movement 5, and in the process to form a flameproof joint, in particular a zero gap between both parts, i.e., the closure part 2 and the receiving part 3. To this end, the closure part 2 is formed as a cover with a disk-shaped segment 6 and a cylindrical segment 7, which has pins 8 projecting radially in a distributed manner across the periphery.

The receiving part 3 can, as shown here, be formed as a hollow cylinder with a base and an open end, at which the cylindrical outer wall 9 of the receiving part 3 contains longitudinal slots 10 that are distributed across the periphery and that extend in the plug-in direction 4, from the ends of which short transverse slots 11 that extend at right angles to the plug direction exit for receiving the pins 8 of the closure part 2. Alternatively, the receiving part 3 can be a hollow cylinder that is open on both sides and that can be connected at both ends via a bayonet catch to a closure part, in each case. The receiving part 3 can also have a different shape to that of a cylinder and have a cylindrical outer walls segment only at the end where it can be connected to the closure part.

The outer diameter of the cylindrical segment 7 of the closure part 2 is only minimally smaller than the inner diameter of the cylindrical outer wall 9 of the receiving part 3 such that, after inserting and screwing the closure part 2 into the receiving part 3, a flameproof joint forms between the cylindrical segment 7 and the cylindrical outer wall 9. Here, a clearance that is significant to the flameproof joint is the wavelength from the interior of the receiving part 3 outward through the gap, which is determined by the height (or length) of the cylindrical segment 7.

After inserting and screwing the closure part 2 into the receiving part 3, the pins 8 come to rest in the transverse slots 11 and lock the closure part 2 with respect to the receiving part 3. The locking part 1 has locking elements 12 distributed across the periphery, which engage into the longitudinal slots 10 in the receiving part 3 when the locking part 1 is slid onto the closure part 2, and as a result prevent the pins 8 from rotating out of the transverse slots 11. In the exemplary embodiment shown in FIG. 1 and FIG. 2, the locking part 1 has an annular segment 13 that can be slid onto the closure part 2, or that is formed as a ring part 14, on which the locking elements 12 are formed as pins that extend in the plug direction 4. The ring part 14 surrounds the closure part 2, without covering the disk-shaped segment 6, such that this remains accessible from the outside. This is important if the closure part 2 contains cable feedthroughs (not shown here), for instance, in the disk-shaped segment 6 or as shown here, an optical window 15 for an electro-optical device accommodated in the receiving part 3, such as an optical gas analyzer (e.g., laser spectrometer). The optical window 15 is arranged here eccentrically with respect to the cylinder axis 16 of the closure part 2, such that a line of sight between the electro-optical device and a predetermined point outside of the explosion-proof pressure-resistant housing can always be established above the insertion position (rotary angle position) of the closure part 2 in the receiving part 3, largely independently of the respective installation position of the electro-optical device in the receiving part 3.

Figure 6:
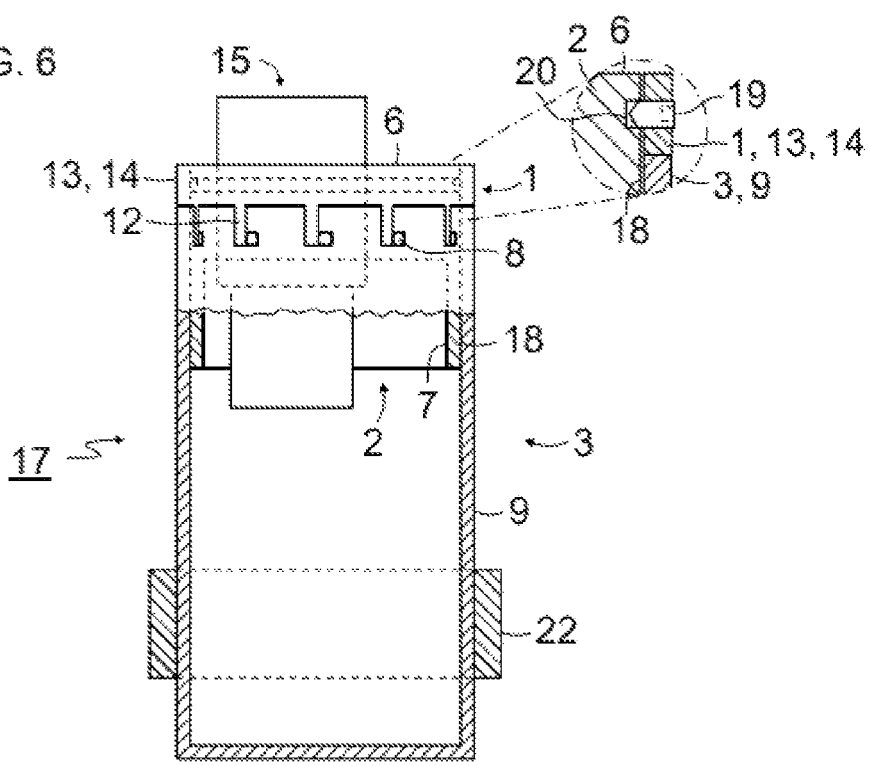
FIG. 6 shows an explosion-proof pressure-resistant housing which consists of the receiving part, closure part and locking part in accordance with the invention.

FIG. 6 shows the explosion-proof, pressure-resistant housing 17 assembled from the receiving part 3, closure part 2 and locking part 1, where the flameproof joint 18 is formed between the cylindrical segment 7 of the closure part 2 and the cylindrical outer wall 9 of the receiving part 3. The pins 8 of the closure part 8 are fixed in the transverse slots 11 (FIG. 5) by the locking elements 12 of the locking part 1. As the enlarged detail of the top right corner of the housing 17 shows, the locking part 1 is fastened to the closure part 2 via a fastener 19, here in the form of a locking screw, so that the closure part 2 cannot unintentionally be detached from the receiving part 3 on account of the pins 8 fixed by the locking elements 12 in the transverse slots 11 (FIG. 5). In order to prevent an unauthorized removal of the closure part 2, the fastener 19 is formed in a manner known per se so that it can only be detached with a special tool. The fastener 19, which can also be a lug or snap-in pin that is elastic or under elastic force, for instance, engages in a cutout 20 on the closure part, which is formed here as a peripheral groove 21 (FIG. 3) in the closure part 2.

Figure 7:
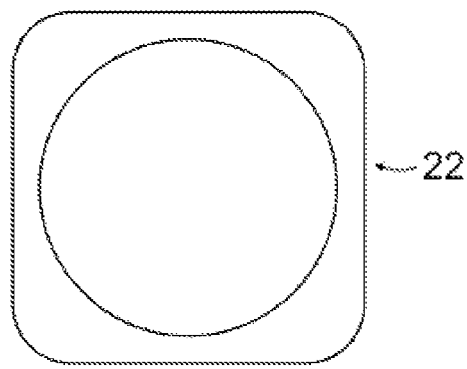
FIG. 7 shows a collar with an angular outer contour in accordance with the invention.

A collar 22 with an angular outer contour can be slid onto the cylindrical receiving part 3 to prevent the receiving part 3 from rolling away when the electrical operating components are installed. FIG. 7 shows the collar 22 in a top view. The collar 22 or a further collar can in particular be positioned at the point of the bayonet joint to cover the locking part 1 with the locking elements 12 in the longitudinal slots 10 and the pins 8 in the transverse slots 11.

Figure 8:
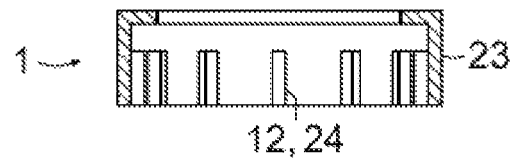
FIG. 8 shows an alternative exemplary embodiment of the locking part in accordance with the invention.

FIG. 8 shows an alternative embodiment of the locking part 1 with a cylindrical pipe segment 23, which can be slid onto the receiving part 3, and on the interior of which the locking elements 12 are formed as ribs 24 that extend in the plug direction 4 (FIG. 3).

Thus, while there have been shown, described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. An explosion-protected pressure-resistant housing comprising:
    a receiving part for electric operating components; and
    a closure part which closes the receiving part via a bayonet catch, said closure part having a cylindrical segment via which a flameproof joint is formed when said closure part is inserted into a cylindrical outer wall or a cylindrical outer wall segment of the receiving part;
    wherein one of the cylindrical segment of the closure part includes pins distributed across a periphery and the cylindrical outer wall and (ii) the cylindrical outer wall segment of the receiving part contains longitudinal slots which extend in a distributed manner across the periphery and in a plug direction, at the ends of which longitudinal slots short transverse slots which extend at right angles to a plug-in direction connect for receiving the pins;
    wherein a locking part is slid onto the closure part, said locking part having locking elements distributed across the periphery which engage in the longitudinal slots such that the pins are prevented from rotating out of the transverse slots; and
    wherein the locking part is fastened to the closure part via at least one fastener which is detachable exclusively via a tool.

2. The explosion-protected pressure-resistant housing as claimed in claim 1, wherein the locking part has an annular segment which is slidable onto the closure part, the locking elements being formed as pins on the annular segment which extend in the plug-in direction.

3. The explosion-protected pressure-resistant housing as claimed in claim 2, wherein the fastener has an elastic snap-fit part which engages into a cut-out on the closure part.

4. The explosion-protected pressure-resistant housing as claimed in claim 2, wherein the fastener has a lock screw which engages into a cut-out (20) on the closure part.

5. The explosion-protected pressure-resistant housing as claimed in claim 1, wherein the locking part has a cylindrical pipe segment which is slidable onto the receiving part, are formed as ribs on an interior of the locking elements which extend in the plug-in direction.

6. The explosion-protected pressure-resistant housing as claimed in claim 5, wherein the fastener has an elastic snap-fit part which engages into a cut-out on the closure part.

7. The explosion-protected pressure-resistant housing as claimed in claim 5, wherein the fastener has a lock screw which engages into a cut-out on the closure part.

8. The explosion-protected pressure-resistant housing as claimed in claim 1, wherein the fastener has an elastic snap-fit part which engages into a cut-out on the closure part.

9. The explosion-protected pressure-resistant housing as claimed in claim 8, wherein the cut-out is formed as a peripheral groove in the closure part.

10. The explosion-protected pressure-resistant housing as claimed in claim 1, wherein the fastener has a lock screw which engages into a cut-out on the closure part.

11. The explosion-protected pressure-resistant housing as claimed in claim 10, wherein the cut-out is formed as a peripheral groove in the closure part.

12. The explosion-protected pressure-resistant housing as claimed in claim 1, wherein the receiving part is configured for electro-optical operating components and the closure part contains an optical window.

13. The explosion-protected pressure-resistant housing as claimed in claim 12, wherein the optical window is arranged eccentrically with respect to the cylinder axis of the closure part.

* * * * *